United States Patent [19]

Postol

[11] Patent Number: 6,085,340
[45] Date of Patent: Jul. 4, 2000

[54] METHOD OF LATTICE QUANTIZATION THAT MINIMIZES STORAGE REQUIREMENTS AND COMPUTATIONAL COMPLEXITY

[75] Inventor: Michael S. Postol, Potomac, Md.

[73] Assignee: The United States of America as represented by the National Security Agency, Washington, D.C.

[21] Appl. No.: 09/096,375

[22] Filed: Jun. 12, 1998

[51] Int. Cl.[7] .......................... H03M 13/00; H03M 7/30
[52] U.S. Cl. ........................ 714/701; 341/200; 714/777
[58] Field of Search .................................. 714/701, 777; 341/200

[56] References Cited

U.S. PATENT DOCUMENTS

| | | | |
|---|---|---|---|
| 4,597,090 | 6/1986 | Forney, Jr. | 375/39 |
| 4,630,288 | 12/1986 | Longstaff et al. | 375/39 |
| 4,894,844 | 1/1990 | Forney, Jr. | 375/42 |
| 4,959,842 | 9/1990 | Forney, Jr. | 375/39 |
| 5,048,056 | 9/1991 | Goldstein | 375/39 |
| 5,150,209 | 9/1992 | Baker et al. | 358/133 |
| 5,297,170 | 3/1994 | Eyuboglu et al. | 375/25 |
| 5,883,981 | 3/1999 | Li et al. | 382/253 |
| 5,999,656 | 12/1999 | Zandi et al. | 382/248 |

OTHER PUBLICATIONS

Wu et al., "New Algorithms for Optimal Binary Vector Quantizer Design", IEEE 1068–0314/95, pp. 132–141, Dec. 1995.
J.H. Conway, N.J.A. Sloane, "Fast 4– and 8–Dimensional Quantizers and Decoders," IEEE, 1981, pp. F4.2.1–F4.2.4.
J.H. Conway, N.J.A. Sloane, "Fast Quantizing and Decoding Algorithms for Lattice Quantizers and Codes," IEEE Trans. on Info. Theory, vol. 1T–28, No. 2, Mar. 1982, pp. 227–232.
J.H. Conway, N.J.A. Sloane, "Soft Decoding Techniques for Codes and Lattices, Including the Golay Code and the Leech Lattice," IEEE Trans. on Info. Theory, vol. 1T–32, No. 1, Jan. 1986, pp. 41–50.

*Primary Examiner*—Stephen Baker
*Attorney, Agent, or Firm*—Robert D. Morelli

[57] ABSTRACT

A method of lattice-quantizing an eight-long data point to minimize storage requirements and computational complexity by acquiring the data point, multiplying each coordinate of the data point by the square root of two to form an inflated data point, rounding each coordinate of the rounded and inflated data point to the nearest integer, reducing modulo-two each coordinate of the rounded and inflated data point to form an initial codeword, multiplying a parity-check matrix of an eight-bit Extending Hamming Code by the result of the last step to form a syndrome, correcting any single-bit errors and double-bit errors, if any, in the initial codeword and the rounded and inflated data point, creating a signal packet if the codeword does not contain any single-bit errors and double-bit errors, and transmitting the signal packet to a receiver. The receiver receives the signal packet, recovers the intended codeword from the table of sixteen codewords in the Extended Hamming Code, modifies the codeword according to the signal packet in order to recover the rounded and inflated data point, replaces each one in the rounded and inflated data point by the reciprocal of the square root of two of the same polarity, and replaces each two in the rounded and inflated data point by the square root of two of the same polarity in order to recover the data point.

8 Claims, 11 Drawing Sheets

METHOD OF LATTICE QUANTIZATION THAT MINIMIZES STORAGE REQUIREMENTS AND COMPUTATIONAL COMPLEXITY

FIELD OF THE INVENTION

This invention relates to pulse or digital communications and, more particularly, to a quantizer or inverse quantizer.

BACKGROUND OF THE INVENTION

A quantizer is a device for converting numerical data into a finite number of possible outputs. That is, the input to a quantizer may be any value, but the output of a quantizer is limited to only certain values. The function of a quantizer is to determine which of its possible output values is closest to the input value and put out that value. For example, a flip-flop puts out either a voltage equal to the power supply voltage connected to the flip-flop (e.g., five volts or a logic one) or a voltage equal to the ground voltage connected to the flip-flop (e.g., zero volts or a logic zero). The input to a flip-flop may be any value between ground voltage and the power supply voltage. The flip-flop determines which of its two possible output values is closest to the input value and puts out that value. Typically, an input voltage greater than or equal to one-half of the power supply voltage will cause a flip-flop to put out the power supply voltage (i.e., a logic one) while an input voltage below one-half of the power supply voltage will cause a flip-flop to put out the ground voltage (i.e., a logic zero).

Quantizers are used in the design of signals for use over a noisy channel. Analog to Digital converters convert complex analog signals (e.g., 0.654783V) into simplistic digital signals (e.g., logic 1). This is a form of data compression. An area centered at one of the allowable outputs is called a Voronoi region. If the quantizer receives a point in this region, it converts it, if necessary, to the allowable point in the center of the region.

Quantizers come in two types (i.e., scaler quantizers and vector quantizers). A scalar quantizer quantizes data from a single source by rounding a real number to its nearest output value (e.g., a flip-flop). A vector quantizer quantizes data from multiple sources by choosing one point from a finite set of points in n-dimensional space that is closest to the point represented by the input vector. A point in n-dimensional space is simply a string of n real numbers. That is, $x=(x_1, x_2, x_3, \ldots, x_n)$. For example, a point in three dimensional space is a point represented by three coordinates, a point in four dimensional space is a point represented by four coordinates, and so on. The allowed output values of a vector quantizer are called centroids.

The present invention concerns a lattice quantizer. A lattice in n-dimensional space is defined as follows. Let $(v_1, v_2, \ldots, v_n)$ be a set of n linearly independent vectors in n-dimensional space. The lattice generated by $(v_1, v_2, \ldots, v_n)$ is the set $(c_1 v_1 + c_2 v_2 + \ldots + c_n v_n)$, where $c_i$ is an integer. The vectors $v_1, v_2, \ldots, v_n$ form a basis for the lattice. If $x=(x_1, x_2, \ldots, x_n)$ then the norm of x is equal to $(x_1^2 + x_2^2 + \ldots + x_n^2)$, where "^" denotes exponentiation. A sphere in n-dimensional space with center $u=(u_1, u_2, \ldots, u_n)$ and radius p consists of all the points $x=(x_1, x_2, \ldots, x_n)$ satisfying $(x_1-u_1)^2 + (x_2-u_2)^2 + \ldots + (x_n-u_n)^2 = p^2$. A sphere packing, or shell packing, is described by specifying the centers u and the radius p. When the centers of a group of spheres form a lattice, the packing is referred to as a lattice packing. A lattice packing always has a center at a point designated as an origin with the remaining centers on concentric spheres around the origin. The shells are numbered according to their proximity to the center or origin point. That is, the shell closest to the origin point is shell 1, the shell second closest to the origin point is shell 2, and so on. If one lattice may be obtained from another by rotation, reflection, or change of scale then it is said that the lattices are equivalent or similar.

Mathematicians continue to look for dense packings of n-dimensional spheres because there are important practical applications of sphere packing to problems arising in digital communications. A finite subset of the points on the surface of a sphere is called a spherical code. Spherical codes may be constructed from sphere packings. The sphere packing density of a lattice is defined by the number of spheres that fit within a particular volume. A kissing number of a lattice is defined as the number of spheres that a sphere in the lattice touches. The eight-dimensional lattice, designated as E8, has the highest sphere packing density and the highest possible kissing number in eight dimensions.

In a lattice quantizer, the centroids are grid points in n-dimensional space. The advantage of using a lattice quantizer is that the centroids are already known and do not have to be calculated from the input data. The disadvantage of using a lattice quantizer is that there are an infinite number of centroids. Because of this, lattice quantizers are only appropriate for quantizing data that has a probability distribution that is heavily concentrated around a single point in n-dimensional space (e.g., the origin).

Quantizing introduces error. The magnitude of the error is the distance from the received point to the acceptable point. The acceptable points are chosen to minimize the error, or more precisely, to minimize the mean squared error. For various dimensions, the mean squared error has been determined. It may be shown that higher dimension quantizers have lower errors per symbol than do lower dimension quantizers. Higher dimension quantizers with their lower errors provide better quantization than do lower dimension quantizers. However, higher dimension quantizers require more capability than lower dimension quantizers and are, therefore, more expensive than lower dimension quantizers. Therefore, a quantizer designer may choose the minimum dimension quantizer that has an acceptable error. It can be shown that going from one dimension to eight dimensions (an addition of seven symbols) reduces the mean squared error from 0.083333 to 0.071682 for an improvement of 2% per added symbol. Above eight dimensions, there is a diminished return for each added symbol. For example, at twelve dimensions the improvement in mean squared error is only 1.45% per added symbol above one dimension. For sixteen dimensions, there is only a 1.2% improvement in the mean squared error per symbol above one dimension. For twenty-four dimensions, there is only a 0.91% improvement in mean squared error per symbol above one dimensions. So, eight dimension quantizers appear to be the most economical quantizers to build.

Quantizers may be used to design signals for data transmission or storage systems (e.g., error correcting codes). A code is a set of signals to be transmitted. Only these codes will be transmitted over a channel. The members of a code are designed to be easily distinguished from the other members of the code even in the presence of noise. Noise may corrupt a particular member of the code, but it is intended that the corrupted code will be identified as the particular code that was transmitted. So, a message to be sent is encoded, sent over a noisy channel, and decoded to recover the message.

Certain important lattices include the cubic lattice $Z^n$, the root lattices (i.e., An, Dn, E6, E7, and E8), the Coxeter-Todd lattice K12, the sixteen dimensional Barnes-Wall lattice, the 24 dimensional Leech lattice, and their duals. These lattices include the best quantizers.

U.S. Pat. No. 5,150,209, entitled "HIERARCHICAL ENTROPY CODED LATTICE THRESHOLD QUANTIZATION ENCODING METHOD AND APPARATUS FOR IMAGE AND VIDEO COMPRESSION," discloses an eight dimensional lattice quantizer based on the E8 lattice that requires the storage of 920 points to encode and decode 2400 points that do not round to the origin point but instead round to a codeword in either shell 1 or shell 2. A reduction in storage from 2400 to 920 (i.e., a 60% improvement) is achieved using the quantizer of U.S. Pat. No. 5,150,209. The present invention uses a rotated equivalent lattice to improve upon the quantizer of U.S. Pat. No. 5,150,209 by reducing even further the number of points that are stored to encode and decode 2400 points that do not round to the origin point. The present invention reduces the number of codewords that must be stored to 16. This is a 98% improvement over the method of U.S. Pat. No. 5,150,209. U.S. Pat. No. 5,150,209 is hereby incorporated by reference into the specification of the present invention.

In three articles authored by John H. Conway and N. J. A. Sloane, entitled "Fast 4- and 8-Dimensional Quantizers and Decoders," IEEE, 1981, pps. F4.2.1–F4.2.4, "Fast Quantizing and Decoding Algorithms for Lattice Quantizers and Codes," *IEEE Transactions on Information Theory*, Vol. IT-28, No. 2, March 1982, and "Soft Decoding Techniques for Codes and Lattices, Including the Golay Code and the Leech Lattice," *IEEE Transactions on Information Theory*, Vol. IT-32, No. 1, January 1986, mathematical techniques associated with lattice quantizers are disclosed but the present invention which minimizes the storage requirement and the computational complexity of an eight dimensional lattice quantizer is not disclosed therein.

SUMMARY OF THE INVENTION

It is an object of the present invention to minimize the storage requirement of an eight-dimensional lattice quantizer.

It is another object of the present invention to only require in an eight-dimensional lattice quantizer the storage of sixteen eight-bit words, the square root of two, the inverse of the square root of two, two tables, and a parity-check matrix.

It is another object of the present invention to minimize the computational complexity of an eight-dimensional lattice quantizer.

It is another object of the present invention to minimize the computational complexity of an eight-dimensional lattice quantizer by requiring only multiplication by the square root of two, replacement of 1s by the inverse of the square root of two, replacement of 2s by the square root of two, and a matrix multiplication.

The present invention is a method of lattice quantization that minimizes the storage requirement and the computational complexity of an eight dimensional lattice quantizer. The idea is to quantize a data point so that it may be transmitted error-free in a noisy channel and reduce bandwidth. This is accomplished, basically, by transmitting a data point in the form of information that indicates a codeword of the Extended Hamming Code that is closest to the data point along with information that would allow a receiver to modify the codeword in order to reconstruct the desired data point. The specific steps of the method of the present invention are as follows.

The first step is to acquire an eight dimensional data point.

The second step is to multiply each coordinate of the data point by the square root of two to form an inflated data point.

The third step is to round each coordinate of the inflated data point to the nearest integer to form a rounded and inflated data point.

The fourth step is to find the modulo-two reduction for the absolute value of each coordinate of the rounded and inflated data point to form an initial codeword. If none of the coordinates of the initial codeword are in error then the initial codeword is one of sixteen codewords of the eight-bit Extended Hamming Code. Such a code may or may not be equivalent to the rounded and inflated data point. If the codeword is not equivalent to the rounded and inflated data point then additional information, as described below, will be provided to allow a receiver to start with the codeword, modify it according to the additional information in order to recover the rounded and inflated data point, and then deflate the rounded and inflated data point in order to recover a data point that is the closest allowable data point that the lattice quantizer could produce from the acquired data point.

The fifth step is to multiply a parity-check matrix of the eight-bit Extended Hamming Code by the initial codeword. The result of this step is four bits, commonly referred to as a syndrome, that indicate whether or not the initial codeword is error free. The eight-bit Extended Hamming Code allows for the detection and correction of one-bit errors and the detection, but not the correction, of two-bit errors. The present invention improves upon the features of the eight-bit Extended Hamming Code by a method that detects and corrects for both one-bit errors and two-bit errors.

If the result of step five is all zeros then the initial codeword is error-free and is a codeword of the eight-bit Extended Hamming Code. A signal packet representing the codeword and information required to make any modifications to the codeword in order to reconstruct the rounded and inflated data point on which the codeword was derived is then sent to the receiver. In a subsequent step, the receiver will then recover the intended data point from the recovered rounded and inflated data point. The steps for generating and sending a signal packet are described below.

If the top-most bit of the result of step five is a 1 then one of the binary bits of the initial codeword is wrong. Since the initial codeword is based on the rounded and inflated data point then the bit location in the rounded and inflated data point that corresponds to the bit location in the initial codeword is also wrong. Therefore, the error bit must be corrected in both the rounded and inflated data point and the initial codeword. The corrected rounded and inflated data point will then be the point that is nearest the intended inflated data point. The corrected rounded and inflated data point will indicate what additional information, if any, must be transmitted to the receiver in order for the receiver to reconstruct the rounded and inflated data point from the codeword. The corrected initial codeword will then match one of the sixteen codewords in the Extended Hamming Code. Information representing the corrected codeword will be sent to the receiver in order to allow the receiver to recover the corrected codeword. The other three bits of the result of step five indicate which coordinate in the rounded and inflated data point, and which bit in the initial codeword, is in error. The error coordinate in the initial codeword is corrected by flipping that bit (i.e, changing a 0 to a 1 or changing a 1 to a 0). The error bit in the rounded and inflated data point is corrected by replacing its value with the value obtained from rounding the opposite way from how that coordinate was originally rounded. For example, if the error coordinate in the rounded and inflated data point is a 1.0 which was based on an inflated data point of 1.3 then the correction would be 2.0. That is, 1.3 originally rounded to the nearest integer 1.0. Since this is in error, then 1.3 should have been rounded the other way to the next closest integer (i.e., 2.0). The error in the rounded and inflated data point, and in the initial codeword, is corrected. Data representing the corrected codeword, and any other information necessary to reconstruct the rounded and inflated data point, is then transmitted to the receiver.

If the top-most bit of the result of step five is a 0 and at least one of the other three bits is a 1 then two of the positions in the rounded and inflated data point and in the initial codeword are wrong. That is, two of the positions in the rounded and inflated data point, and two bits in the initial codeword, must be changed. As above, the corrected rounded and inflated data point yields a point closest to the inflated data point while the corrected codeword yields a codeword in the eight-bit Extended Hamming Code. The other three bits of the result of step five are used to determine which two bits in the rounded and inflated data point and in the initial codeword are wrong. After the two bit locations in the rounded and inflated data point and the initial codeword are identified, the bits in error are corrected as described above. Data representing the corrected codeword, and any other information necessary to reconstruct the rounded and inflated data point is then transmitted to the receiver.

The present invention stores a table, in both the transmitter and the receiver, that contains the sixteen eight-bit codewords of the eight-bit, or eight-dimensional, Extended Hamming Code. These sixteen codewords are used to represent the 2400 data points in shell 1 and shell 2. This compares very favorably to the 920 codewords stored in U.S. Pat. No. 5,150,209 in order to represent the same number of data points in shell 1 and shell 2. The transmitter and receiver may also store a table that indicates where two 2s may be located in a rounded and inflated data point. Instead or storing a table to identify the location of two 2s, the locations may be determined from an equation representing a particular table construction. The transmitter also stores a parity-check matrix for the eight-bit Extended Hamming Code and the square root of two. The transmitter multiplies the acquired data point by the square root of two in order to form an inflated data point. The transmitter also multiplies the parity-check matrix by the initial codeword. The receiver stores either the reciprocal of the square root of two or the reciprocal of the square root of two and the square root of two. In order for the receiver to deflate an inflated data point the receiver either multiplies each coordinate of the inflated data point by the reciprocal of the square root of two or replaces each 1 by the reciprocal of the square root of two and each 2 by the square root of two. The polarity of the 1s and 2s are also taken into account by setting a polarity bit accordingly. By using the replacement approach, the equivalent of multiplication is achieved more efficiently.

To transmit a representation of an all 0s codeword in shell 1, and information necessary to modify the codeword in order to recover the rounded and inflated data point on which it is based, nine bits are transmitted. Four bits indicate the position in the eight-bit Extended Hamming Code table where the codeword may be found. The receiver initially sets the rounded and inflated data point equal to the codeword and then modifies it according to the other information transmitted in order to reconstruct the intended rounded and inflated data point if different. The other information includes, one bit to indicate that the rounded and inflated data point is in shell 1, three bits to indicate which bit in the rounded and inflated data point should be a 2, and one bit to indicate the polarity of the 2. In order to recover the intended data point, each 1 in the recovered rounded and inflated data point is replaced with the reciprocal of the square root of two of the same polarity, and each 2 in the recovered rounded and inflated data point is replaced with the square root of two.

To transmit a representation of an all 0s codeword in shell 2, and information necessary to modify the codeword to the rounded and inflated data point on which it is based, twelve bits are transmitted. Four bits indicate the position in the eight-bit Extended Hamming Code table where the codeword may be found. Again, the receiver initially sets the rounded and inflated data point equal to the codeword and then modifies it according to the other information sent in order to reconstruct the intended rounded and inflated codeword. The other information includes, one bit to indicate that the rounded and inflated data point is in shell 2, five bits to indicate the position in a table that tells the receiver which two bits in the inflated data point are 2s, one bit to indicate the polarity of the first 2, and one bit to indicate the polarity of the second 2. In order to recover the intended data point, each 1 in the recovered rounded and inflated data point is replaced with the reciprocal of the square root of two of the same polarity, and each 2 in the recovered rounded and inflated data point is replaced with the square root of two.

To transmit a representation of an all 1's codeword in shell 2, and information necessary to modify it in order to recover the intended rounded and inflated data point, twelve bits are transmitted. The rounded and inflated data point is initially set to the intended codeword, and the codeword is modified according to the additional information in order to recover the intended rounded and inflated data point. The rounded and inflated data point is then deflated in order to recover the intended data point. That is, four bits indicate the position in the eight-bit Extended Hamming Code table where the codeword may be found, one bit to indicate the polarity of the first 1 in the rounded and inflated data point, one bit to indicate the polarity of the second 1 in the rounded and inflated data point, one bit to indicate the polarity of the third 1 in the rounded and inflated data point, one bit to indicate the polarity of the fourth 1 in the rounded and inflated data point, one bit to indicate the polarity of the fifth 1 in the rounded and inflated data point, one bit to indicate the polarity of the sixth 1 in the rounded and inflated data point, one bit to indicate the polarity of the seventh 1 in the rounded and inflated data point, and one bit to indicate the polarity of the eighth 1 in the rounded and inflated data point. In order to recover the intended data point, each 1 in the recovered rounded and inflated data point is replaced with the reciprocal of the square root of two of the same polarity, and each 2 in the recovered rounded and inflated data point is replaced with the square root of two of the same polarity.

To transmit a representation of a weight-four codeword in shell 1, and information necessary to modify the codeword in order to recover the intended rounded and inflated data point, nine bits are transmitted. That is, four bits to indicate the position in the eight-bit Extended Hamming Code table where the codeword may be found, one bit to indicate that the rounded and inflated data point is in shell 1, one bit to indicate the polarity of the first 1 in the rounded and inflated data point, one bit to indicate the polarity of the second 1 in the rounded and inflated data point, one bit to indicate the polarity of the third 1 in the rounded and inflated data point, and one bit to indicate the polarity of the fourth 1 in the rounded and inflated data point. In order to recover the intended data point, each 1 in the recovered rounded and inflated data point is replaced with the reciprocal of the square root of two of the same polarity, and each 2 in the recovered rounded and inflated data point is replaced with the square root of two of the same polarity.

To transmit a representation of a weight-four codeword in shell 2, and information necessary to modify the codeword in order to recover the intended rounded and inflated data point, twelve bits are transmitted. That is, four bits to indicate the position in the eight-bit Extended Hamming Code table where the intended codeword may be found, one bit to indicate that the rounded and inflated data point is in shell 2, one bit to indicate the polarity of the first 1 in the rounded and inflated data point, one bit to indicate the polarity of the second 1 in the rounded and inflated data point, one bit to indicate the polarity of the third 1 in the rounded and inflated data point, one bit to indicate the polarity of the fourth 1 in the rounded and inflated data point, two bits to indicate which coordinate in the rounded and inflated data point must be a 2, and one bit to indicate the polarity of the 2. In order to recover the intended data point, each 1 in the recovered rounded and inflated data point is replaced with the reciprocal of the square root of two of the same polarity, and each 2 in the recovered rounded and inflated data point is replaced with the square root of two of the same polarity.

A signal packet that represents a codeword which is based on a rounded and inflated data point that is closest to the inflated data point, and information necessary to modify the codeword in order to reconstruct the rounded and inflated data point, is then transmitted to a receiver. The receiver decodes the signal packet in order to reconstruct the intended codeword, reconstruct the rounded and inflated data point from the intended codeword, and recovers the intended data point from the rounded and inflated data point. Note that only two tables and two values need be stored by the receiver in order to do this. That is, the table of sixteen codewords of the eight-bit Extended Hamming Code, a table that lists the twenty-eight different ways that two 2s may appear in a rounded and inflated data point, the reciprocal of the square root of two, and the square root of two. In an alternate embodiment, the 2s position table may be replaced by a function that represents the equation of a suitable 2s position table.

DETAILED DESCRIPTION

Figure 1:
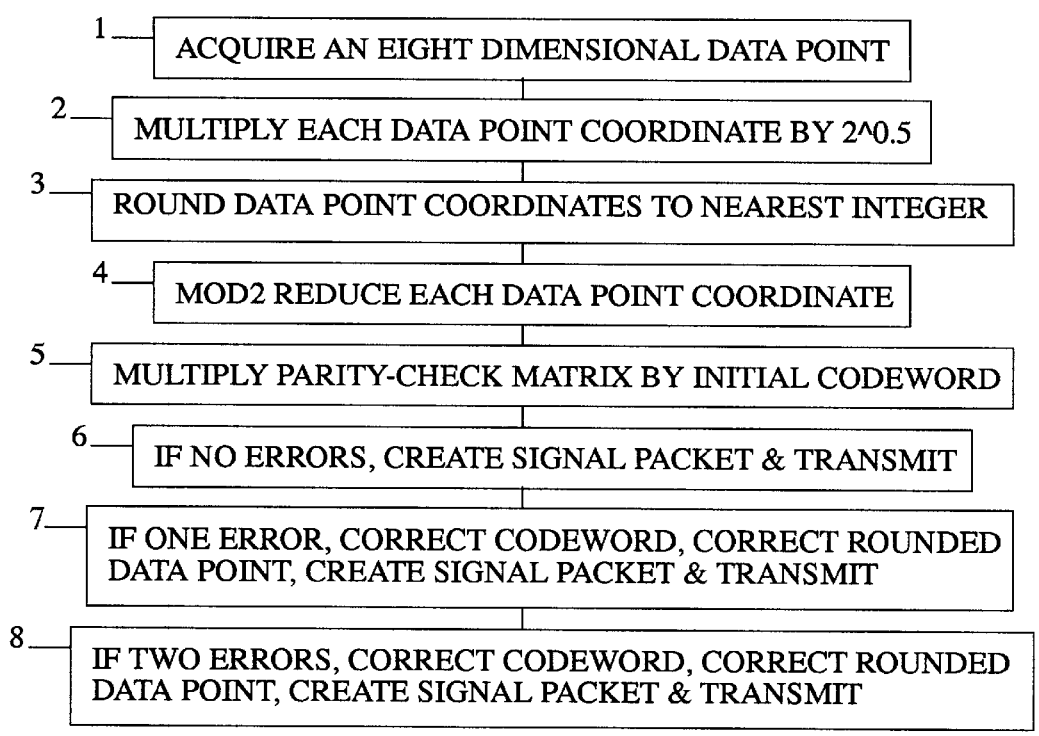
FIG. 1 is a list of steps for quantizing a data point prior to transmission.

The present invention is a method of lattice quantizing an eight-bit data point so that storage requirements and computational complexity are minimized. The present invention improves upon the method of U.S. Pat. No. 5,150,209. In U.S. Pat. No. 5,150,209, 2400 lattice points that do not round to the origin point (i.e., 240 points in shell 1 and 2160 points in shell 2) are represented by 920 points which must be stored. This is a reduction of about 61% over having to store 2400 points. The present invention uses a different, but equivalent, lattice than the one used in U.S. Pat. No. 5,150,209. The lattice used in the present invention has the same number of points in shell 1 and shell 2 as the lattice used in U.S. Pat. No. 5,150,209. The method of the present invention only requires the storage of a table of sixteen codewords, a table for determining the positions of two 2s in an eight-bit data point, a parity-check matrix, the square root of two, and the reciprocal of the square root of two. The storage of sixteen codewords represents an improvement of about 98% over the codeword storage requirement of U.S. Pat. No. 5,150,209. Also, the computations required by U.S. Pat. No. 5,150,209 are more complex than those required by the present invention. The present invention only requires multiplication by the square root of two to form an inflated data point at the transmitter and a matrix multiplication at the transmitter. Multiplication by the reciprocal of the square root of two at the transmitter may be simulated by replacing each plus or minus 1 by plus or minus the reciprocal of the square root of two and replacing each plus or minus 2 by plus or minus the square root of two.

FIG. 1 lists the steps of lattice-quantizing an eight-bit data point for transmission. The first step 1 is to acquire an eight dimensional data point $x=(x_1, x_2, x_3, x_4, x_5, x_6, x_7, x_8)$, where each value (e.g., $x_1$) is a coordinate of the data point. The lattice used in the present invention is one where multiplying each coordinate of the data point by the square root of two (i.e., inflating the data point) and then reducing each coordinate of the inflated data point modulo-two results in a codeword in the eight-bit Extended Hamming Code. There are sixteen codewords in the eight-bit Extended Hamming Code, and these codewords must be stored at the transmitter and the receiver. The present invention can detect and correct both single-bit errors and double-bit errors. This is an improvement over the method of the Extended Hamming Code which detects and corrects single-bit error but can only detect, but not correct, double bit errors. The lattice used in the present invention is a rotation of the lattice used in U.S. Pat. No. 5,150,209. Symmetries in the rotated lattice are exploited in order to reduce the number of codewords that must be stored as compared to U.S. Pat. No. 5,150,209.

The second step 2 is to multiply each coordinate of the data point by the square root of two to form an inflated data point $y=(y_1, y_2, y_3, y_4, y_5, y_6, y_7, y_8)$. That is, $y_1=(x^1 \times 2^{\wedge}0.5)$, $y_2=(x_2 \times 2^{\wedge}0.5)$, ..., and $y_8=(x_8 \times 2^{\wedge}0.5)$, where "X" denotes multiplication and "^" denotes exponentiation.

The third step 3 is to round each coordinate of the inflated data point to the nearest integer to form a rounded and inflated data point $yr=(yr_1, yr_2, yr_3, yr_4, yr_5, yr_6, yr_7, yr_8)$. For example, if $x_1=1.0$ then $y_1=1.0 \times 2^{\wedge}0.5=1.414$, and $y_1$ would be rounded to form $yr_1=1.0$.

The fourth step 4 is to reduce by modulo-two the absolute value of each coordinate of the rounded and inflated data point yr to form an initial determination of the most appropriate codeword $cw_{init}$ to represent the rounded and inflated data point on which it is based. For example, if yr=(0, −2, 1, 1, 0, 0, 0, 0), then $cw_{init}$=(0, 0, 1, 1, 0, 0, 0, 0).

The fifth step 5 is to multiply a parity-check matrix of the eight-bit Extended Hamming Code by $cw_{init}$, where $cw_{init}$ is represented as a column matrix. The parity-check matrix must be stored by the transmitter and is as follows:

```
11111111

00011110

01100110

10101010.
```

If $cw_{init}$=(0, 0, 1, 1, 0, 0, 0, 0) then the result of the fifth step 5 is as follows:

```
11111111   0    0+0+1+1+0+0+0+0 = 0
00011110 X 0 =  0+0+0+1+0+0+0+0 = 1
01100110   1    0+0+1+0+0+0+0+0 = 1
10101010   1    0+0+1+0+0+0+0+0 = 1
           0
           0
           0
           0
```

The result of multiplying the above parity-check matrix by $cw_{init}$, where $cw_{init}$ is represented as a column matrix, is a four bit word, or syndrome, that is used to determine whether or not $cw_{init}$ is error free, contains one bit that is in error, or contains two bits that are in error. Since the rounded and inflated data point is the basis for $cw_{init}$, whichever positions are in error in $cw_{init}$ are also in error in the rounded and inflated data point. The rounded and inflated data must be corrected in order to determine the inflated lattice point closest to the inflated version of the acquired data point. The $cw_{init}$ must be corrected in order to find the codeword in the eight-bit Extended Hamming Code that must be represented and transmitted to a receiver.

If each of the four bits resulting from the fifth step 5 is a zero then $cw_{init}$ is error free and is equal to one of the sixteen codewords in the eight-bit Extended Hamming Code. The $cw_{init}$ may then be transmitted, in an efficient form that will be described below, to a receiver along with information that allows a receiver to modify the codeword in order to recover the rounded and inflated data point. From the recovered rounded and inflated data point, the receiver will recover the intended data point. If $cw_{init}$ is to be transmitted to the receiver then the next step 6 in the method is to prepare $cw_{init}$ and the additional information for transmission. The steps for preparing $cw_{init}$ and the additional information for transmission are described below and are listed in FIGS. 2–6.

If the top-most bit of the four bits resulting from the fifth step 5 in FIG. 1 is a 1 then one of the binary bits of $cw_{init}$ is wrong. Since $cw_{init}$ is based on the rounded and inflated data point, any bit in $cw_{init}$, that is wrong is also wrong in the rounded and inflated data point. The binary number formed by the bottom-three bits of the result of the fifth step 5, where the bottom-most bit is the least significant bit, indicates which bit position is wrong in both $cw_{init}$ and the rounded and inflated data point. The one exception to this rule is when the top-most bit is a 1 and the other three bits are each 0. In this case, the eighth bit position of $cw_{init}$ is wrong. To correct the error in $cw_{init}$, which results in changing $cw_{init}$ to one of the sixteen codewords in the eight-bit Extended Hamming Code, the bit position of $cw_{init}$ that is wrong is flipped. That is, if the bit position that is wrong is a 1 then it is changed to a 0. If the bit position that is wrong is a 0 then it is changed to a 1. To correct the error bit in the rounded and inflated data point, round the basis for the error bit the opposite way from how it was rounded to get the original rounded and inflated data point. For example, if the error bit in the rounded and inflated data point is 1.0 and its was based on an inflated data point of 1.3 then 1.3 would be rounded the opposite way (i.e., to 2) to correct that bit. The corrected rounded and inflated data point would then be used to determine what additional information must be transmitted so that the receiver may modify the correct codeword to recover the correct rounded and inflated data point. The corrected codeword may then be transmitted, in an efficient manner, to the receiver along with additional information that would enable the receiver to reconstruct the correct rounded and inflated data point from the codeword. If one bit in $cw_{init}$ is wrong then the next step 7 in the method is to find the error in $cw_{init}$ and the rounded and inflated data point as described above, correct the error in $cw_{init}$ and the rounded and inflated data point, and prepare the corrected codeword and the additional information for transmission to the receiver. The steps for preparing the corrected codeword and the additional information for transmission are described below and are listed in FIGS. 2–6.

If the top-most bit of the four bits resulting from the fifth step 5 is a zero and at least one of the other three bits is a 1 then two of the bits in $cw_{init}$ are wrong. Again, whichever bits that are wrong in $cw_{init}$ are also wrong in the rounded and inflated data point. The bottom three bits, interpreted as a binary number, where the bottom-most bit is the least significant bit, provides information for determining which two bits in $cw_{init}$ and the inflated and rounded data point are wrong. Correcting a two-bit error is one of the unique aspects of the present invention.

If the columns of the parity-check matrix of the eight-bit Extended Hamming Code are summed two at a time, then there will be twenty-eight pairs of columns to sum. That is, eight things taken two at a time results in twenty-eight pairs as follows:

$$(8,2)=8!/((8-2)!\times 2!)=28.$$

Each column in the parity-check matrix is made up of four binary bits. Summing two columns is equivalent to doing a bit-wise modulo-2 addition on corresponding bits in the two columns. For example, a column consisting of 1010 summed with a column consisting of 1100 results in binary bits 0110, or the decimal number 6. Four pairs of columns sum to decimal number 1, four pairs of columns sum to decimal number 2, . . . , and four pairs of columns sum to decimal number 7. The pairs of columns that sum to decimal number 1 are (1,8), (2,3), (4,5) and (6,7), where the numbers in the parenthesis represent the position of two columns in the parity-check matrix described above, where column numbering starts at the left-most column which is column number one and proceeds linearly to the right-most column which is column number 8. The pairs of columns that sum to decimal number 2 are (2,8), (1,3), (4,6), and (5,7). The pairs of columns that sum to decimal number 3 are (3,8), (1,2), (4,7), and (5,6). The pairs of columns that sum to decimal number 4 are (4,8), (1,5), (2,6), and (3,7). The pairs of columns that sum to decimal number 5 are (5,8), 1,4), 2,7), and (3,6). The pairs of columns that sum to decimal number 6 are (6,8), (1,7), (2,4), and (3,5). The pairs of columns that sum to decimal number 7 are (7,8), (1,6), (2,5), and (3,4). We are not interested in the columns that sum to decimal number 8 (i.e., binary 1000 as described above) since the sum of 8 (i.e., the top-most bit is 1 and the bottom-three bits are each 0) indicates that one error occurred but not two errors. One-bit errors were already addressed above, and the present description concerns correcting two-bit errors.

The column positions in a particular pair of columns that sum to the non-zero three bottom-most bits of the result of the fifth step 5, when the top-most bit is a zero, equate to the two bit positions in $cw_{init}$ that are wrong. Since $cw_{init}$ is based on the rounded and inflated data point, these same two positions are also wrong in the rounded and inflated data point. Therefore, the column-position pairs may be viewed as bit-position pairs. But there are four pairs of columns that sum to each non-zero value of the three bottom-most bits. Which one pair of these four pairs represents the two bit positions in $cw_{init}$ and the rounded and inflated data point that are wrong?

If the four-bit result of the fifth step 5 includes at least one 1 and the top-most bit is a 0 then find the difference $y_{diff}=yr-y$ between the coordinates of the rounded and inflated data point yr and the inflated data point y. For example, if yr=(0, −2, 1, 1, 0, 0, 0, 0) and y=(0.42, −1.7, 1.27, 1.13, 0.0, 0.14, 0.0, 0.0) then $y_{diff}$=(−0.42, −0.3, −0.27, −0.13, 0.0, 0.14, 0.0, 0.0).

Next, for each column-position pair that sums to the number represented by the bottom-three bits of the result of the fifth step 5 (i.e., four pairs), add the absolute value of the two coordinates of $y_{diff}$ that correspond to the values contained in the column-position pair. In the example above, the four column-position pairs that add to 7 are (7,8), (1,6), (2,5), and (3,4). Therefore, four sums will be generated in this step. The first sum is the sum of the absolute values of coordinates 7 and 8 of $y_{diff}$ (e.g., 0.0+0.0=0.0). The second sum is the sum of the absolute values of coordinates 1 and 6 of $y_{diff}$ (e.g., 0.42+0.14=0.56). The third sum is the sum of the absolutes value of coordinates 2 and 5 of $y_{diff}$ (e.g., 0.3+0.0=0.3). The fourth sum is the sum of the absolute values of coordinates 3 and 4 of $y_{diff}$ (e.g., 0.27+0.13=0.40).

Next, flip those bits in $cw_{init}$ that correspond to the bit-positions represented by the column-position pair that generated the largest sum in the last step. In the example above, column-position pair (1,6) generated the largest sum in the last step (i.e., 0.56). Since column position relates to bit position in $cw_{init}$, flip the first and sixth bit in $cw_{init}$ to correct the two bits that were wrong. In the example above, $cw_{init}$ is changed from (0, 0, 1, 1, 0, 0, 0, 0) to (1, 0, 1, 1, 0, 1, 0, 0). The bit positions that were in error in $cw_{init}$ must also be corrected in the rounded and inflated data point. The procedure described above for correcting a single bit error in the rounded and inflated data point is used to correct each of the two error bits. That is, each bit in the rounded and inflated data point that formed the basis for an erroneous bit is rounded the opposite way from how it was rounded originally. In the present example, the first and sixth bits (i.e., 0 and 0) in the rounded and inflated data point are wrong. In the present example, these originally rounded values were based on 0.42 and 0.14, respectively, which rounded to 0 and 0, respectively. To the correct these two bits, they should be rounded the opposite way to 1.0 and 1.0, respectively. Therefore, the corrected rounded and inflated data point changes from (0, −2, 1, 1, 0, 0, 0, 0) to (1, −2, 1, 1, 0, 1, 0, 0).

The corrected codeword (e.g., (1, 0, 1, 1, 0, 1, 0, 0)), which now matches one of the sixteen codewords in the eight-bit Extended Hamming Code, is then transmitted, in an efficient manner, to the receiver along with additional information that enables the receiver to recover the intended codeword, reconstruct the intended rounded and inflated data point (e.g., (1, −2, 1, 1, 0, 1, 0, 0)) from the codeword, and recover the intended data point from the recovered rounded and inflated data point. If two bits in $cw_{init}$ are wrong then the next step 8 in the method is to find the two errors as described above, correct the errors in both $cw_{init}$ and the rounded and inflated data point, and prepare the corrected codeword and the additional information for transmission to the receiver. The steps for preparing the corrected codeword and the additional information for transmission are described below and are listed in FIGS. 2–6.

The lattice of the present invention is based on the eight-bit Extended Hamming Code. The sixteen eight-bit codewords contained in the eight-bit Extended Hamming Code are as follows:

0. (0, 0, 0, 0, 0, 0, 0, 0);
1. (0, 0, 0, 1, 1, 1, 1, 0);
2. (0, 0, 1, 0, 1, 1, 0, 1);
3. (0, 0, 1, 1, 0, 0, 1, 1);
4. (0, 1, 0, 0, 1, 0, 1, 1);
5. (0, 1, 0, 1, 0, 1, 0, 1);
6. (0, 1, 1, 0, 0, 1, 1, 0);
7. (0, 1, 1, 1, 1, 0, 0, 0);
8. (1, 0, 0, 0, 0, 1, 1, 1);
9. (1, 0, 0, 1, 1, 0, 0, 1);
10. (1, 0, 1, 0, 1, 0, 1, 0);
11. (1, 0, 1, 1, 0, 1, 0, 0 );
12. (1, 1, 0, 0, 1, 1, 0, 0);
13. (1, 1, 0, 1, 0, 0, 1, 0);
14. (1, 1, 1, 0, 0, 0, 0, 1); and
15. (1, 1, 1, 1, 1, 1, 1, 1).

Position numbers are given to each codeword because it takes fewer bits to transmit the position of a codeword (i.e., four bits) than it does to transmit an eight-bit codeword (i.e., eight bits). The position numbers are used in the steps of FIGS. 2–6 to efficiently represent a codeword to be transmitted Note that the eight-bit Extended Hamming Code contains an all 0s codeword, an all is codeword, and fourteen codewords that have weight four (i.e., codewords that contain four ones).

Figure 2:
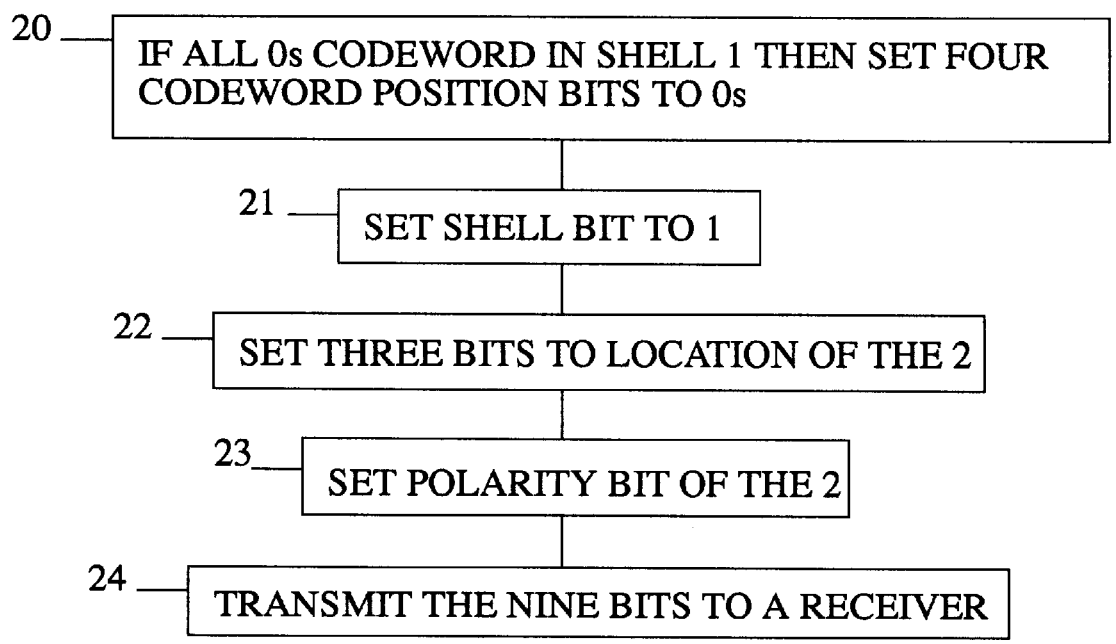
FIG. 2 is a list of steps for transmitting a signal packet for an all 0s codeword in shell 2.

FIG. 2 lists the steps for transmitting an all 0s codeword in shell 1 and additional information that enables a receiver to recover the codeword and modify the codeword in order to recover the rounded and inflated data point on which the codeword is based. A rounded and inflated data point in shell 1 is represented by an all 0s codeword consists of seven 0s and one 2 distributed therein. As mentioned above, the eight-bit codeword need not be transmitted. Only the four-bit binary number that represents the position of the codeword in the list above need be transmitted in order to identify the codeword to the receiver. This requires that both the transmitter and the receiver store the sixteen eight-bit codewords of the Extended Hamming Code using an identical position numbering scheme. Any suitable position numbering scheme that may be represented using four bits may be used. For example, the transmitter need only transmit binary bits 1010 if it wishes to transmit codeword (1, 0, 1, 0, 1, 0, 1, 0) which is at decimal position 10 in the list of codewords above.

The first step 20 in preparing an all 0s codeword in shell 1 for transmission is to set four bits (e.g., the first four bits) to the position of the all 0s codeword (e.g., all 0s in the codeword list above). Other bit locations may be used to indicate codeword position. Additional information must now be added in order to instruct the receiver on how to modify the codeword in order to recover the rounded and inflated data point.

The next step 21 is to set a bit (e.g., the fifth bit) to tell the receiver that the all 0s codeword of shell 1 is in shell 1. The bit may be set to 1 to indicate shell 1, but the inverse may be used.

Since the rounded and inflated data point referred to by an all 0s codeword in shell 1 is eight-bits long and contains a 2, three additional bits are needed to tell the receiver the location of the 2. Therefore, the next step 22 is to set three bits (e.g., the sixth bit, the seventh bit, and the eighth bit) to a binary value that indicates which coordinate in the codeword must be changed to a 2.

The next step 23 is to set a bit (e.g., the ninth bit) to a value that indicates the polarity of the 2. A 0 bit may indicate +2 and a 1 bit may indicate −2, or it may be the other way around.

The last step 24 of FIG. 2 is to transmit the nine bits described above to a receiver. The receiver will receive the signal packet, recover the intended codeword, and use the additional information to modify the codeword in order to recover the rounded and inflated data point. The inflated data point will then be deflated in order to recover the intended data point. The steps for recovering the intended data point based on an all 0s codeword in shell 1 are described below and listed in FIG. 7.

Figure 3:
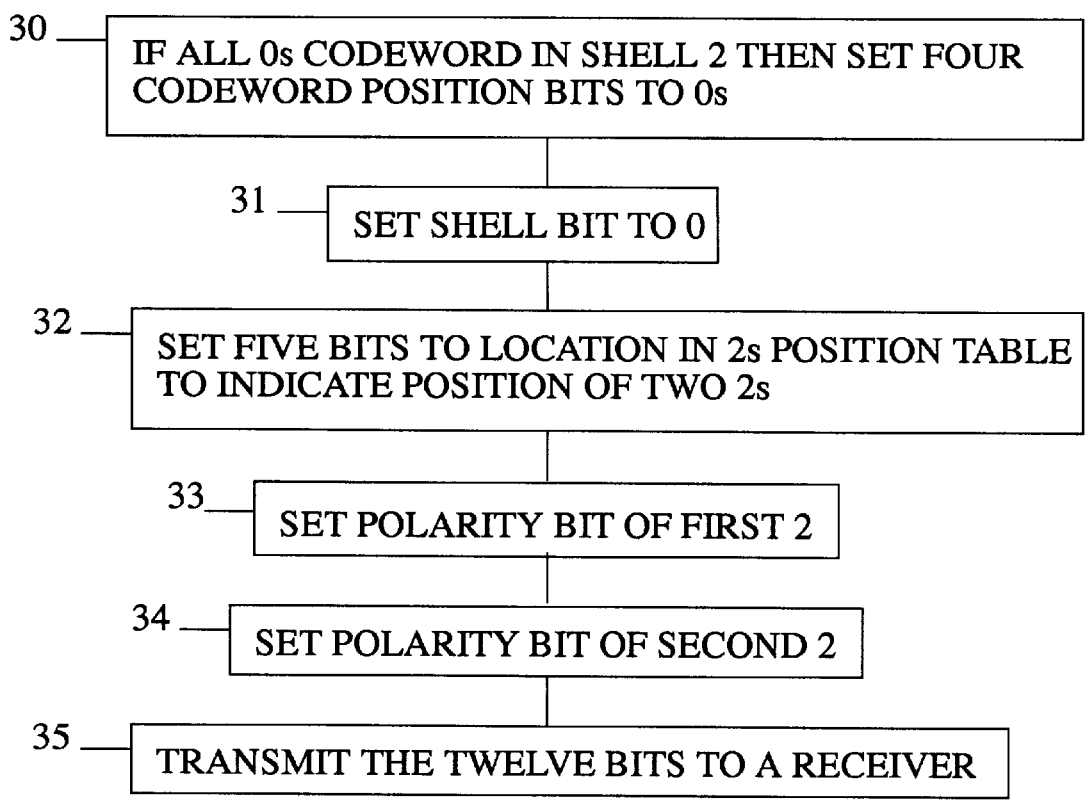
FIG. 3 is a list of steps for transmitting a signal packet for an all 0s codeword in shell 2.

FIG. 3 lists the steps for transmitting an all 0s codeword in shell 2 and additional information that enables a receiver to recover the codeword and modify the codeword in order to recover the rounded and inflated data point on which it is based. An all 0s codeword in shell 2 represents a rounded and inflated data point that consists of six 0s and two 2s distributed therein. The first step 30 is to set four bits (e.g., the first four bits) to the position of the all 0s codeword in the listing of the codewords of the eight-bit Extended Hamming Code (e.g., all 0s).

The next step 31 is to set a bit (e.g., the fifth bit) to a value (e.g., 0) that tells the receiver that the all 0s codeword is in shell 2.

There are two 2s in the rounded and inflated data point in shell 2. There are twenty-eight different ways that two 2s may appear in an eight-bit word. Instead of transmitting three bits for each 2 to tell the receiver the location of that 2, it is more efficient to create a table with twenty-eight positions, where each position in the table contains the locations of the two 2s. In an alternate embodiment, an equation may be used to represent a 2s position table. If an equation is used, a table need not be stored but a calculation must be made in order to determine the position of the two 2s. So, there is a trade-off between storing a table and making a calculation. Storing a 2s position table is preferred. Only five bits are needed to represent twenty-eight positions. Using a 2s position look-up table saves one bit. Also, this requires that both the transmitter and the receiver store the identical 2s position look-up table. The twenty-eight position pairs may be distributed throughout the table in any suitable manner. So, the next step 32 is to set five bits (e.g., the sixth bit, the seventh bit, the eight bit, the ninth bit, and the tenth bit) to a binary number that represents the position in the 2s position look-up table that contains information that tells the receiver which two coordinates of the recovered codeword must be changed to 2s.

One example of a 2s position listing which includes a position number and the two coordinate positions that must be changed to 2s for each position is as follows:

0. 1,2
1. 1,3
2. 1,4
3. 1,5
4. 1,6
5. 1,7
6. 1,8
7. 2,3
8. 2,4
9. 2,5
10. 2,6
11. 2,7
12. 2,8
13. 3,4
14. 3,5
15. 3,6
16. 3,7
17. 3,8
18. 4,5
19. 4,6
20. 4,7
21. 4,8
22. 5,6
23. 5,7
24. 5,8
25. 6,7
26. 6,8
27. 7,8

The next step 33 is to set a bit (e.g., the eleventh bit) to indicate the polarity of the first 2 in the rounded and inflated data point. A 0 bit may be used to indicate a positive number and a 1 bit may be used to indicate a negative number, but this may be reversed.

The next step 34 is to set a bit (e.g., the twelfth bit) to indicate the polarity of the second 2 in the rounded and inflated data point.

The last step 35 listed in FIG. 3 is to transmit the twelve bits described above to a receiver.

Figure 4:
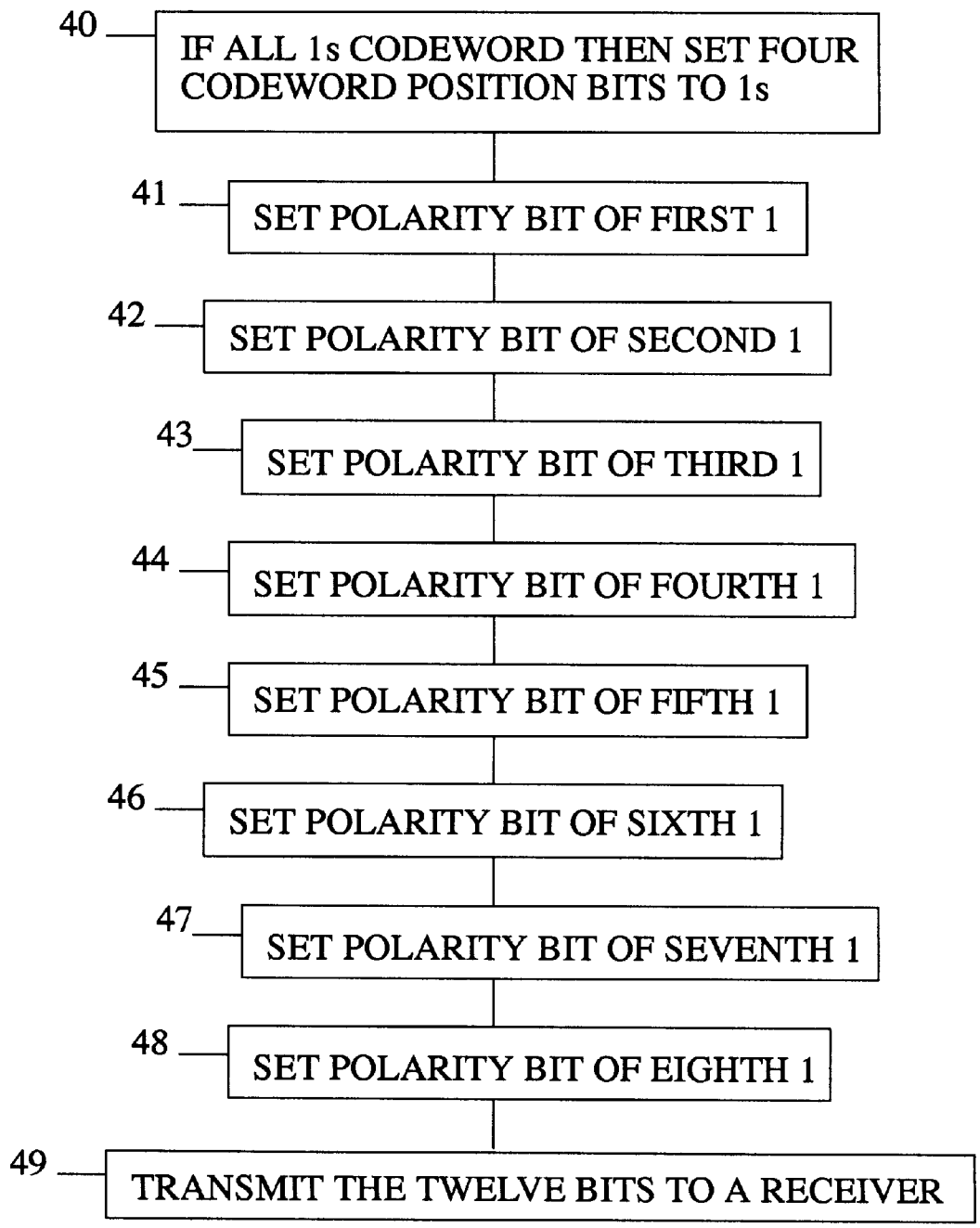
FIG. 4 is a list of steps for transmitting a signal packet for an all 1s codeword in shell 2.

FIG. 4 lists the steps for transmitting an all 1s codeword and additional information that enables a receiver to recover the codeword and modify the codeword in order to recover the rounded and inflated data point on which the codeword is based. The rounded and inflated data point that resulted in an all 1s codeword is in shell 2 and is never in shell 1. So, a bit indicating shell need not be transmitted. A rounded and inflated data point based on an all 1s codeword consists of eight 1s, where each 1 may be either positive or negative. The first step 40 is to set four bits (e.g., the first four bits) to the position in the table of codewords of the eight-bit Extended Hamming Code where the all 1s codeword (e.g., all 1s) may be found.

The next step 41 is to set a bit (e.g., the fifth bit) to indicate the polarity of the first 1 in the rounded and inflated data point. A 0 may be used to indicate +1, and a 1 may be used to indicate −1, but this may be reversed. The next step 42 is to set a bit (e.g., the sixth bit) to indicate the polarity of the second 1 in the rounded and inflated data point. The next step 43 is to set a bit (e.g., the seventh bit) to indicate the polarity of the third 1 in the rounded and inflated data point. The next step 44 is to set a bit (e.g., the eighth bit) to indicate the polarity of the fourth 1 in the rounded and inflated data point. The next step 45 is to set a bit (e.g., the ninth bit) to indicate the polarity of the fifth 1 in the rounded and inflated data point. The next step 46 is to set a bit (e.g., the tenth bit) to indicate the polarity of the sixth 1 in the rounded and inflated data point. The next step 47 is to set a bit (e.g., the eleventh bit) to indicate the polarity of the seventh 1 in the rounded and inflated data point. The next step 48 is to set a bit (e.g., the twelfth bit) to indicate the polarity of the eighth 1 in the rounded and inflated data point. The last step 49 in FIG. 4 is to transmit the twelve bits described above to a receiver.

Figure 5:
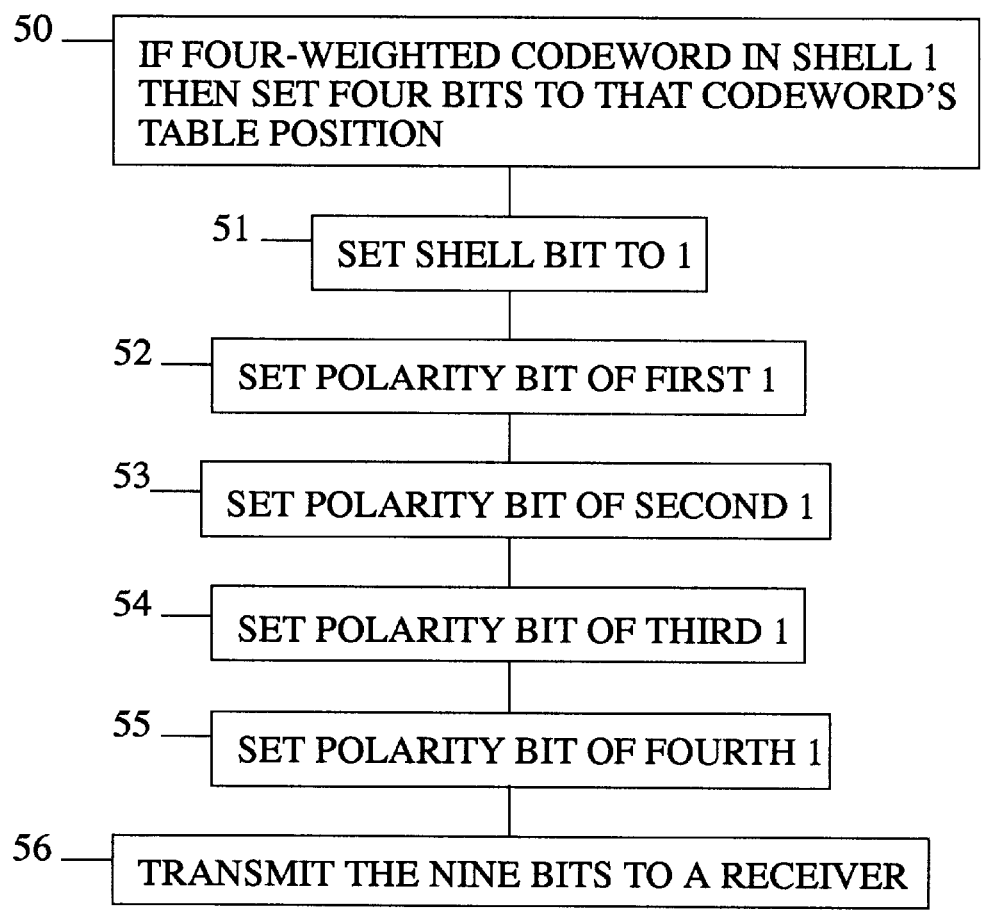
FIG. 5 is a list of steps for transmitting a signal packet for a weight-four codeword in shell 1.

FIG. 5 lists the steps for transmitting a codeword of weight four that is in shell 1 and additional information that enables a receiver to recover the codeword and modify the codeword in order to recover the rounded and inflated data point on which the codeword is based. A rounded and inflated data point based on a codeword of weight four that is in shell 1 consists of four 1s and four 0s distributed therein. Each 1 bit in the rounded and inflated data point may be either positive or negative. The first step 50 is to set four bits (e.g., the first four bits) to the position of the corresponding codeword of weight four in the list of codewords in the eight-bit Extended Hamming Code.

The next step 51 is to set a bit (e.g., the fifth bit) to a value (e.g., 1) to indicate that the codeword is in shell 1. The next step 52 is to set a bit (e.g., the sixth bit) to indicate the polarity of the first 1 in the rounded and inflated data point. A 0 may be used to indicate +1 and a 1 may be used to indicate −1, but this may be reversed. The next step 53 is to set a bit (e.g., the seventh bit) to indicate the polarity of the second 1 in the rounded and inflated data point. The next step 54 is to set a bit (e.g., the eighth bit) to indicate the polarity of the third 1 in the rounded and inflated data point. The next step 55 is to set a bit (e.g., the ninth bit) to indicate the polarity of the fourth 1 in the rounded and inflated data point. The last step 56 in FIG. 5 is to transmit the nine bits described above to a receiver.

Figure 6:
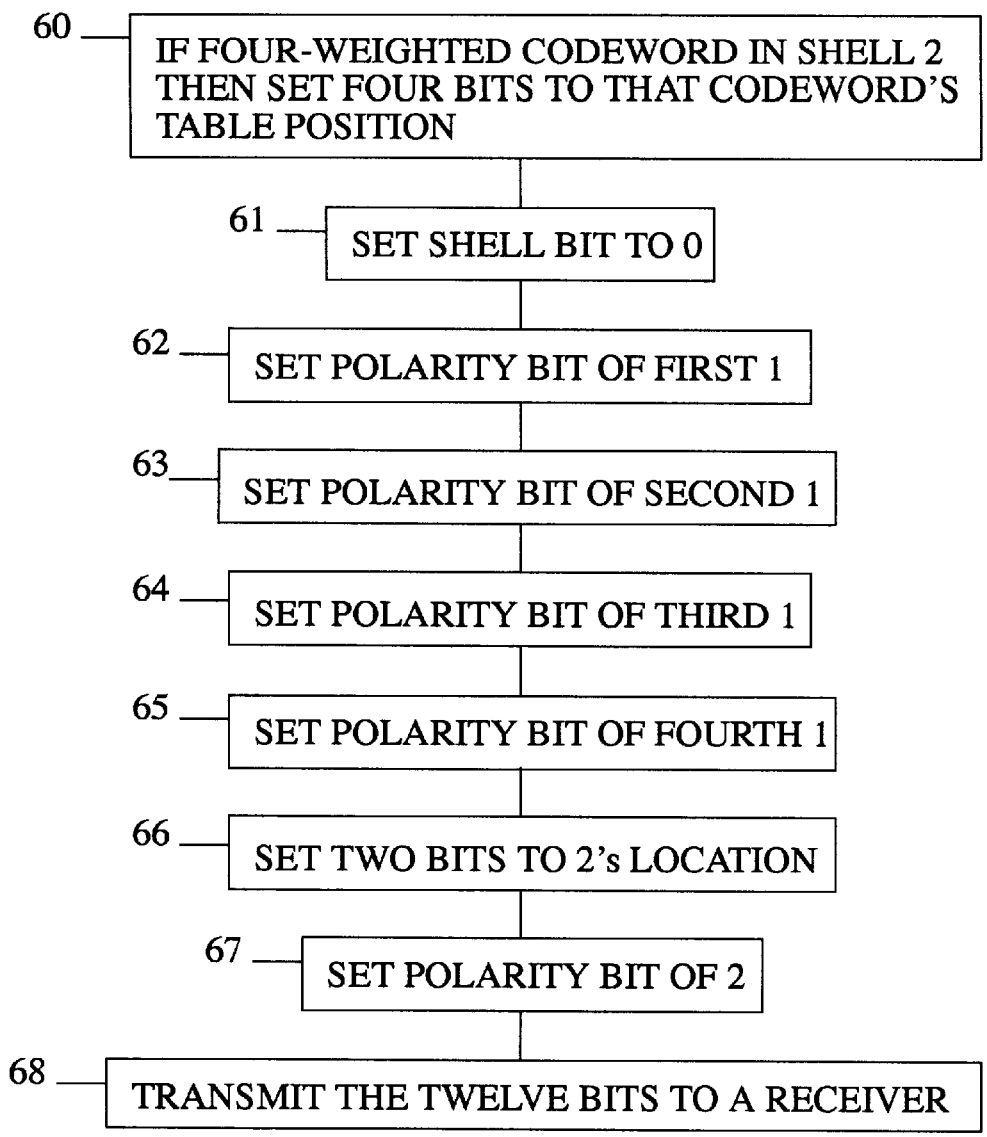
FIG. 6 is a list of steps for transmitting a signal packet for a weight-four codeword in shell 2.

FIG. 6 lists the steps for transmitting a codeword of weight four that is in shell 2 and additional information that enables a receiver to recover the codeword and modify it in order to recover the rounded and inflated data point on which it is based. A rounded and inflated data point based on a codeword of weight four that is in shell 2 consists of four 1s, a 2, and three 0s distributed therein. Each 1 bit and the 2 bit in the rounded and inflated data point may be either positive or negative. The first step 60 is to set four bits (e.g., the first four bits) to the position in the codeword table of the eight-bit Extended Hamming Code where the codeword to be transmitted may be found.

The next step 61 is to set a bit (e.g., the fifth bit) to a value (e.g., 0) to indicate that the codeword is in shell 2. The next step 62 is to set a bit (e.g., the sixth bit) to indicate the polarity of the first 1 in the rounded and inflated data point. A 0 bit may be used to indicate a positive number and a 1 bit may be used to indicate a negative number, but this may be reversed. The next step 63 is to set a bit (e.g., the seventh bit) to indicate the polarity of the second 1 in the rounded and inflated data point. The next step 64 is to set a bit (e.g., the eighth bit) to indicate the polarity of the third 1 in the rounded and inflated data point. The next step 65 is to set a bit (e.g., the ninth bit) to indicate the polarity of the fourth 1 in the rounded and inflated data point. The next step 66 is to set two bits (e.g., the tenth bit and the eleventh bit) to indicate the location of the 2 in the rounded and inflated data point. Only two bits are needed for this because the 1s are ignored and the other four positions are thought of as each being 0. The two bits indicate which of the 0s is replaced with a 2 (i.e., the first 0, the second 0, the third 0, or the fourth 0). The next step 67 is to set a bit (e.g., the twelfth bit) to indicate the polarity of the 2. The last step 68 in FIG. 5 is to transmit the twelve bits described above to a receiver.

Once a signal packet, in one of the forms described above, is received by a receiver the receiver has to determine which type of codeword is represented by the received packet (i.e., an all 0s codeword in shell 1, an all 0s codeword in shell 2, an all 1s codeword in shell 1, a four-weighted codeword in shell 1, or a four-weighted codeword in shell 2), reconstruct the codeword, modify it according to the additional information received in order to recover the rounded and inflated data point on which the codeword is based, and recover the data point from the rounded and inflated data point. The receiver must store and use the same eight-bit Extended Hamming Code table that was stored and used by the transmitter. The steps associated with each type of transmission are listed below in FIGS. 7–11.

Figure 7:
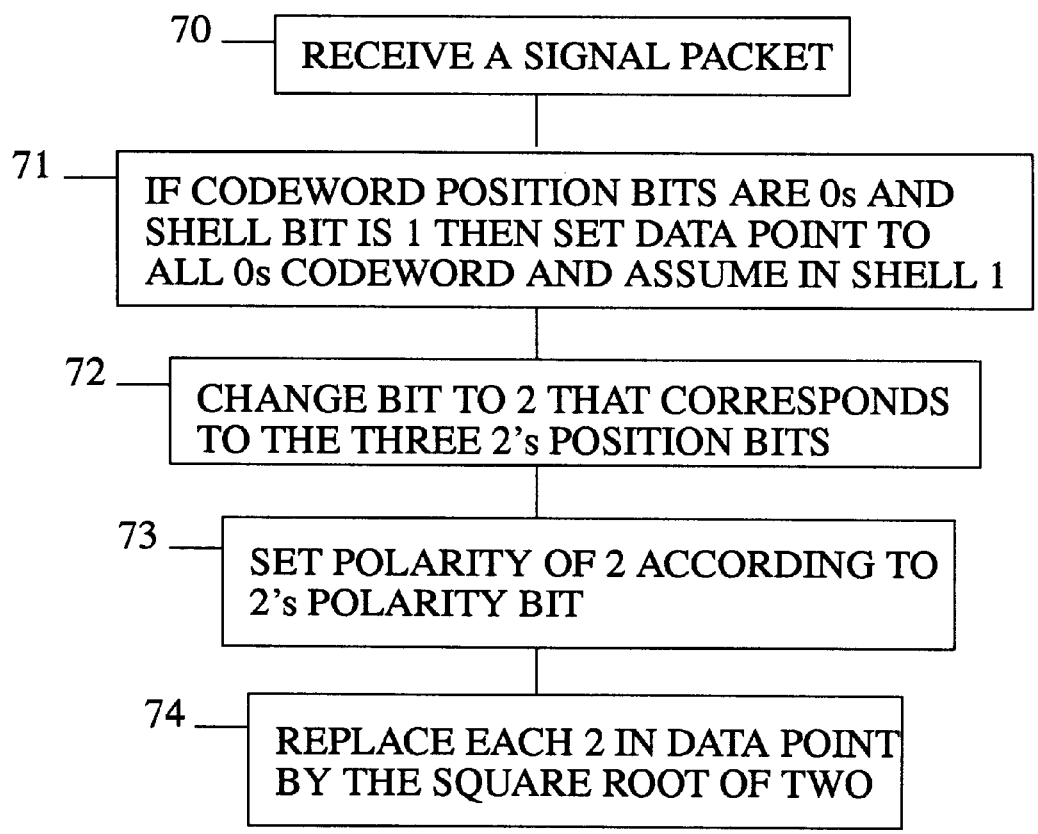
FIG. 7 is a list of steps for decoding a signal packet for an all 0s codeword in shell 1.

FIG. 7 lists the steps that a receiver must perform in order to reconstruct a data point from a signal packet containing all 0s codeword in shell 1 and additional information that enables the receiver to recover the rounded and inflated data point on which the codeword is based. The first step 70 is to receive the signal packet. The next step 71 is to determine whether or not the first four bits represent the all 0s codeword of the eight-bit Extended Hamming Code (e.g., are the first four bits 0s?) and whether or not the shell bit indicates that the codeword is in shell 1 (e.g., is the shell bit a 1?). If these five bits indicate that the codeword is all 0s and it is in shell 1, then the rounded and inflated data point is set to the all 0s codeword of the eight-bit Extended Hamming Code. A rounded and inflated data point in shell 1 consists of all 0s with one bit being either a +2 or a −2. The next step 72 is to change the coordinate in the rounded and inflated data point to a 2 that corresponds to the decimal equivalent of the three binary bits that represent the location of the 2 (e.g., bits six, seven, and eight). The next step 73 is to determine the polarity of the 2 from the 2 polarity bit and change the 2 in the rounded and inflated data point accordingly. The last step 74 is to replace the 2 with the square root of two in order to recover the data point. This is equivalent to multiply each coordinate of the rounded and inflated data point by the reciprocal of the square root of two. Replacing a value with another value is more efficient that multiplying.

Figure 8:
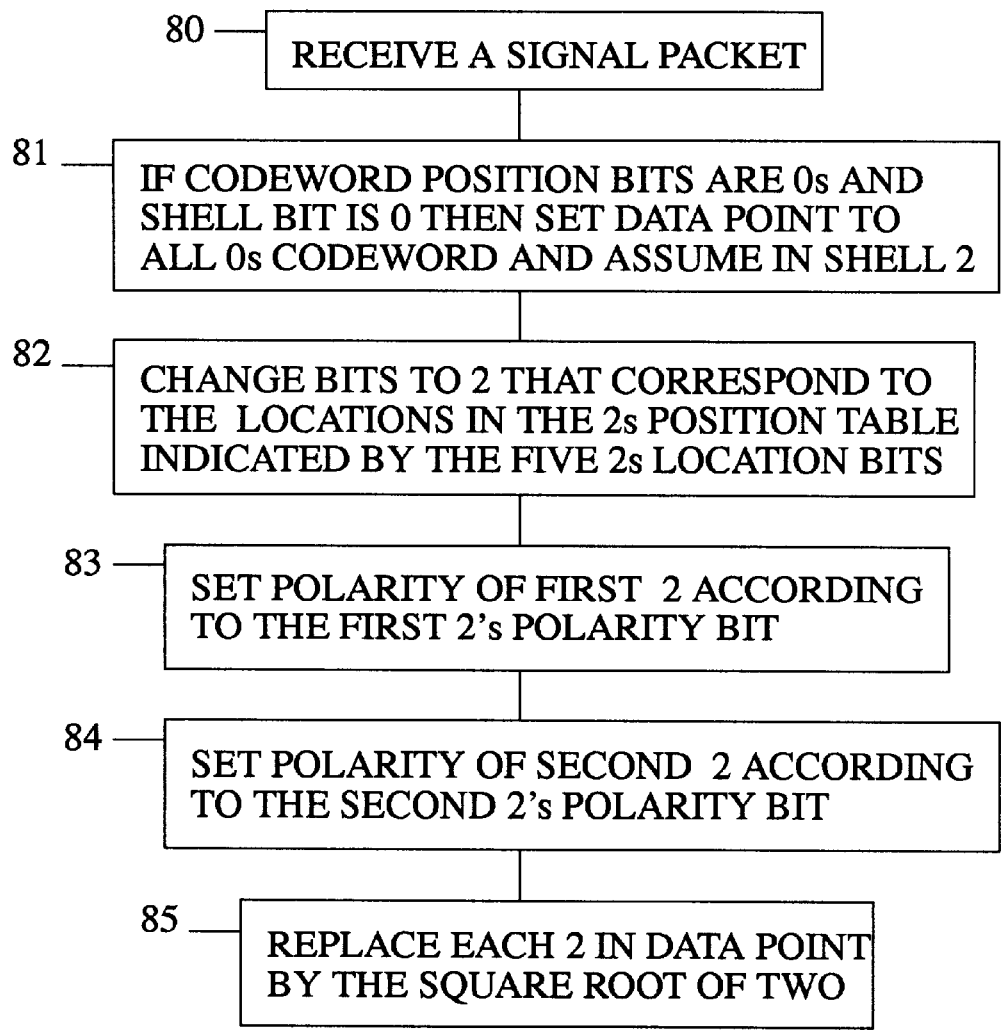
FIG. 8 is a list of steps for decoding a signal packet for an all 0s codeword in shell 2.

FIG. 8 lists the steps that a receiver must perform in order to recover an all 0s codeword in shell 2, modify the codeword in order to recover the rounded and inflated data point on which the codeword is based, and recover the data point from the rounded and inflated data point. The first step 80 is to receive the signal packet. The next step 81 is to determine whether or not the signal packet represents an all 0s codeword in shell 2 (i.e., are the first four bits 0s and is the fifth bit a 0?). If these five bits indicate that the codeword is all 0s and is in shell 2, then the rounded and inflated data point is set to the codeword. The next step 82 is to change two coordinates in the rounded and inflated data point to 2s according to five bits (e.g., bits six, seven, eight, nine, and ten) of the received signal packet. The five bits indicate where in a 2s position table may be found the two coordinates that must be changed to 2s. The 2s position table stored by the receiver must be identical to the 2s position table stored by the transmitter. In an alternate embodiment, an equation for the table may be used instead of the 2s position look-up table. An equation would require some computation instead of merely a look up. The next step 83 is to set the polarity of the first 2 in the rounded and inflated data point according to the polarity bit of the first 2 (e.g., the eleventh bit in the received signal packet). The next step 84 is to set the polarity of the second 2 in the rounded and inflated data point according to the polarity bit of the second 2 (e.g., the twelfth bit in the received signal packet). The last step 85 is to recover the data point from the rounded and inflated data point by replacing each 2 with the square root of two. A replacement value must have the same polarity as the value it is replacing. Replacement here is equivalent to multiplying each coordinate of the rounded and inflated data point in order to recover the data point. Replacement is much more efficient than multiplication.

Figure 9:
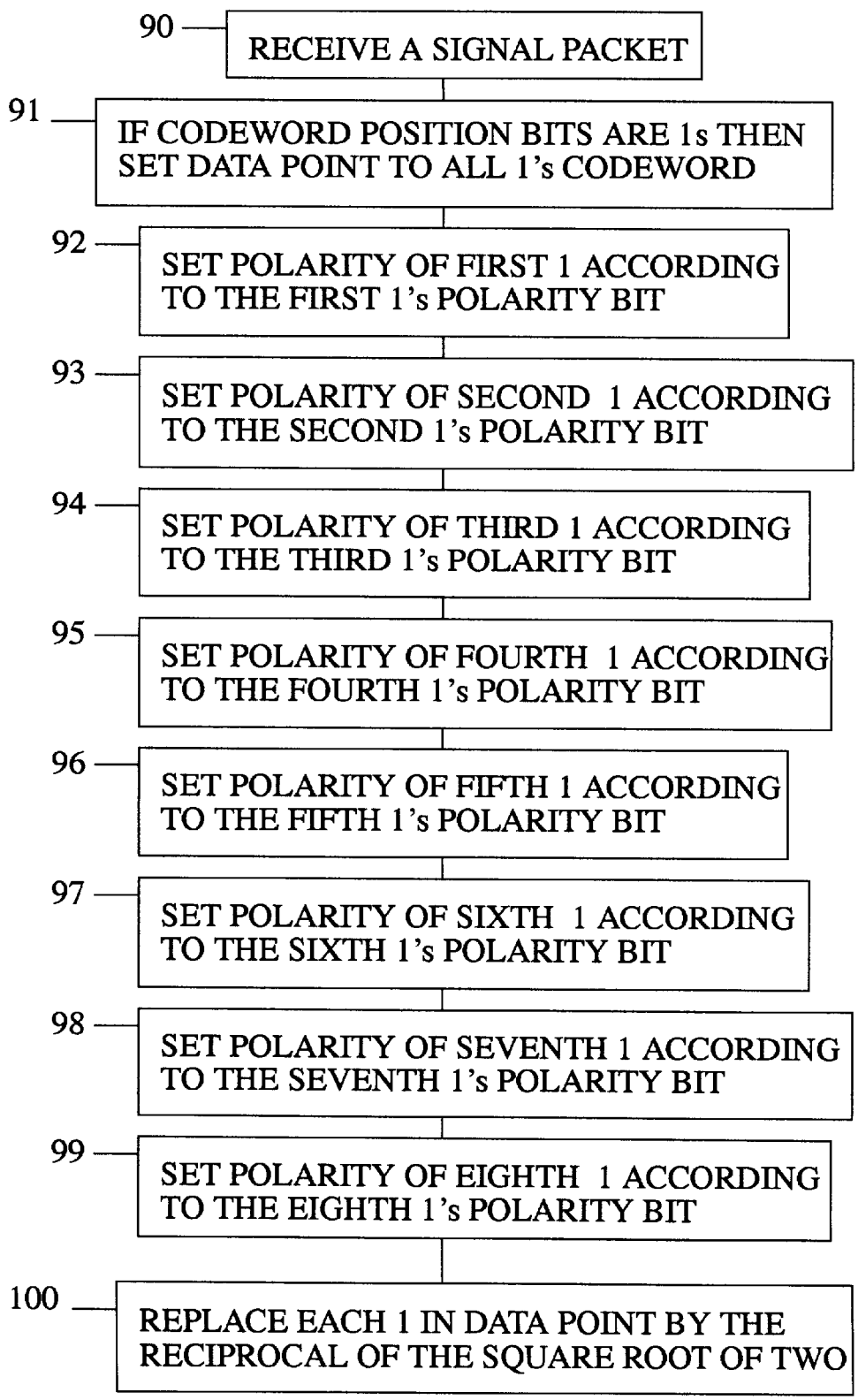
FIG. 9 is a list of steps for decoding a signal packet for an an 1s codeword in shell 2.

FIG. 9 lists the steps that a receiver must perform in order to recover an all 1s codeword in shell 2, modify the codeword in order to recover the rounded and inflated data point on which the codeword is based, and recover the data point from the rounded and inflated data point. The first step 90 is to receive a signal packet. The next step 91 is to determine whether or not four bits (e.g., the first four bits) represent the all 1s codeword of the eight-bit Extended Hamming Code (e.g., are all 1s?). If these four bits indicate that the codeword is all 1s, then the rounded and inflated data point is set to the all is codeword. An inflated data point based on an all is codeword consists of all 1s, where each 1 may be positive or negative. The next step 92 is to set the polarity of the first 1 in the rounded and inflated data point according to the first polarity bit (e.g., the fifth bit) in the received signal packet. The next step 93 is to set the polarity of the second 1 in the rounded and inflated data point according to the second polarity bit (e.g., the sixth bit) in the received signal packet. The next step 94 is to set the polarity of the third 1 in the rounded and inflated data point according to the third polarity bit (e.g., the seventh bit) in the received signal packet. The next step 95 is to set the polarity of the fourth 1 in the rounded and inflated data point according to the fourth polarity bit (e.g., the eighth bit) in the received signal packet. The next step 96 is to set the polarity of the fifth 1 in the rounded and inflated data point according to the fifth polarity bit (e.g., the ninth bit) in the received signal packet. The next step 97 is to set the polarity of the sixth 1 in the rounded and inflated data point according to the sixth polarity bit (e.g., the tenth bit) in the received signal packet. The next step 98 is to set the polarity of the seventh 1 in the rounded and inflated data point according to a seventh polarity bit (e.g., the eleventh bit) in the received signal packet. The next step 99 is to set the polarity of the eighth and last 1 in the rounded and inflated data point according to the eighth polarity bit (e.g., the twelfth bit) in the received signal packet. The last step 100 is to replace each 1 in the rounded and inflated data point by the reciprocal of the square root of two in order to recover the data point. The polarity of the replacement value must be the same polarity as the value being replaced. Replacement here is equivalent to multiplying each coordinate of the rounded and inflated data point by the reciprocal of the square root of two. Replacement is much more efficient than multiplication.

Figure 10:
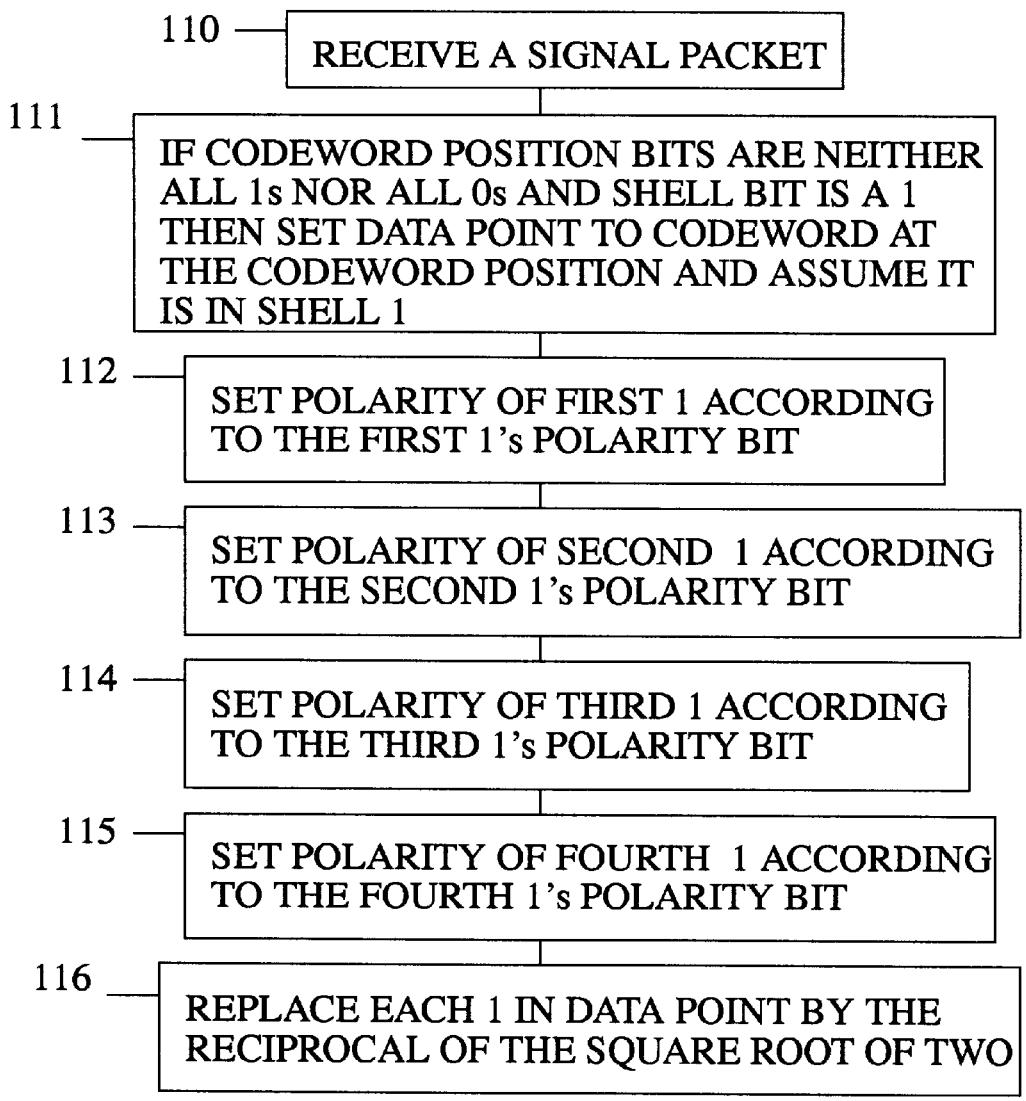
FIG. 10 is a list of steps for decoding a signal packet for a weight-four codeword in shell 1.

FIG. 10 lists the steps that a receiver must perform in order to recover a codeword of weight four in shell 1, modify the codeword in order to recover the rounded and inflated data point on which the codeword is based, and recover the intended data point from the rounded and inflated data point. A rounded and inflated data point in shell 1 consists of four 1s and four 0s distributed therein, where the 1s may be positive or negative. The first step 110 is to receive a signal packet. The second step 111 is to determine whether or not four bits (e.g., the first four bits) indicate that the codeword is of weight four a fifth bit (e.g., the fifth bit) indicates that the codeword is in shell 1. If so, the rounded and inflated data point is set to the codeword in the eight-bit Extended Hamming Code at the position indicated by the four bits. The next step 112 is to set the polarity of the first 1 in the rounded and inflated data point according to the first polarity bit (e.g., the sixth bit) in the received signal packet. The next step 113 is to set the polarity of the second 1 in the rounded and inflated data point according to the second polarity bit (e.g., the seventh bit) in the received signal packet. The next step 114 is to set the polarity of the third 1 in the rounded and inflated data point according to the third polarity bit (e.g., the eighth bit) in the received signal packet. The next step 115 is to set the polarity of the fourth 1 in the rounded and inflated data point according to the fourth polarity bit (e.g., the ninth bit) in the received signal packet. The last step 116 is to replace each 1 in the rounded and inflated data point with the reciprocal of the square root of two. The polarity of each replacement value must be the same polarity as the value that it replaces. By replacing each 1 in the rounded and inflated data point as described above, the data point is recovered from the rounded and inflated data point.

Figure 11:
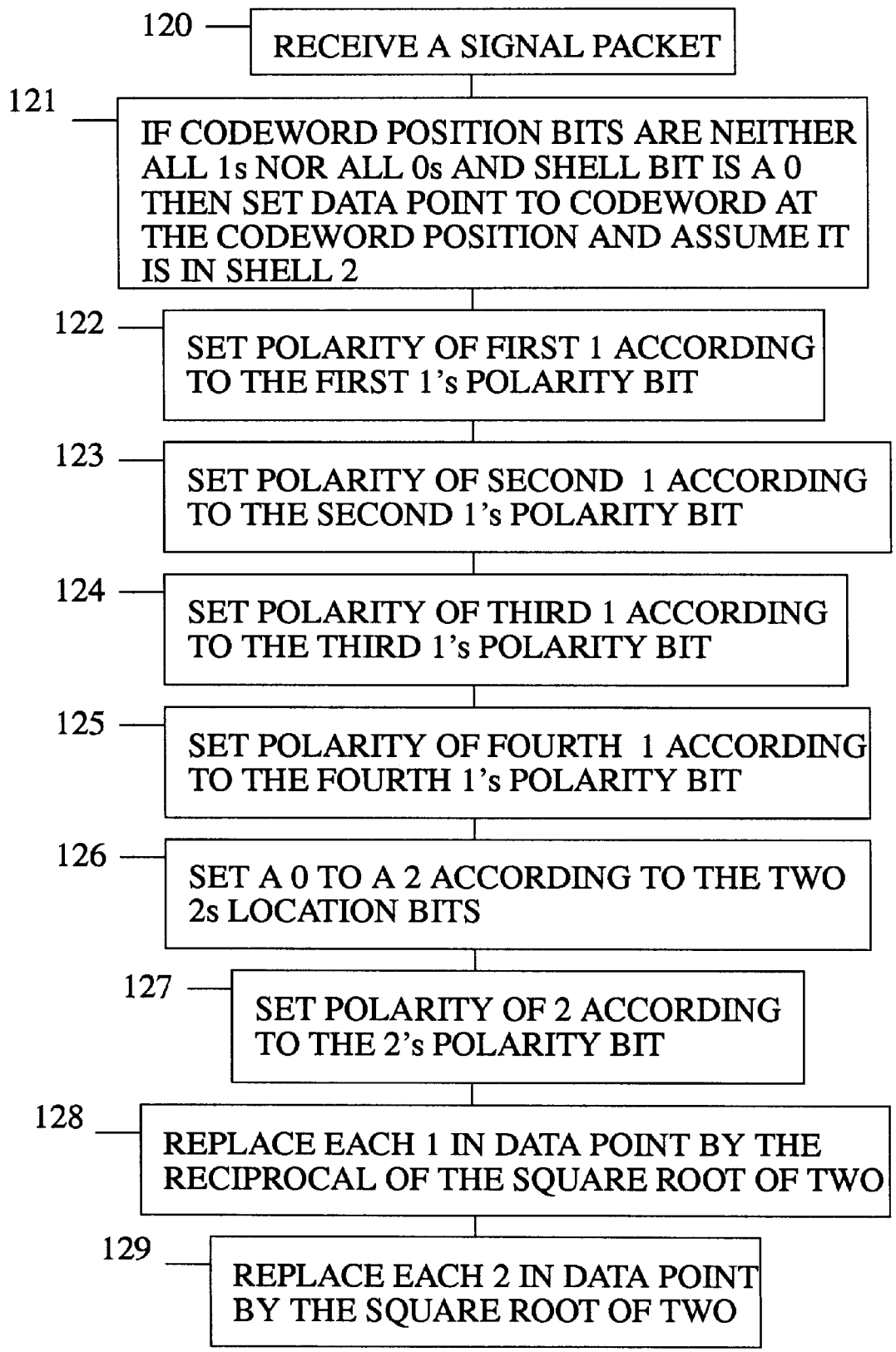
FIG. 11 is a list of steps for decoding a signal packet for a weight-four codeword in shell 2.

FIG. 11 lists the steps that a receiver must perform in order to recover a codeword of weight four in shell 2, modify the codeword in order to recover the rounded and inflated data point on which the codeword is based, and recover the data point from the rounded and inflated data point. A rounded and inflated data point of weight four in shell 2 consists of four 1s, three 0s, and one 2 distributed therein, where each 1 and the 2 may be either positive or negative. This may be thought of as a rounded and inflated data point consisting of four 1s and four 0s, where one of the 0s is changed to a 2. The first step 120 is to receive a signal packet. The second step 121 is to determine whether or not four codeword position bits (e.g., the first four bits in the received signal packet) represent a codeword of weight four and a fifth bit (e.g., the fifth bit in the received signal packet) indicates that the codeword is in shell 2. If the codeword is of weight four and in shell 2 then the rounded and inflated data point is set to the codeword at the position in the eight-bit Extended Hamming Code represented by the four bits. The next step 122 is to set the polarity of the first 1 in the rounded and inflated data point according to the first polarity bit (e.g., the sixth bit) in the received signal packet. The next step 123 is to set the polarity of the second 1 in the rounded and inflated data point according to the second polarity bit (e.g., the seventh bit) in the received signal packet. The next step 124 is to set the polarity of the third 1 in the rounded and inflated data point according to the third polarity bit (e.g., the eighth bit) in the received signal packet. The next step 125 is to set the polarity of the fourth 1 in the rounded and inflated data point according to the fourth polarity bit (e.g., the ninth bit) in the received signal packet. The next step 126 is to change the 0 in the rounded and inflated data point to a 2 according to the position represented by two 2s position bits (e.g., bits ten and eleven in the received signal packet). The next step 127 is to set the polarity of the 2 in the rounded and inflated data point according to the 2 polarity bit (e.g., the twelfth bit) in the signal packet received. The next step 128 is to replace each 1 in the rounded and inflated data point with the reciprocal of the square root of two. The polarity of each replacement value must be the same polarity as the value that it replaces. The last step 129 is to replace each 2 in the rounded and inflated data point with the square root of two. By replacing each 1 and each 2 in the rounded and inflated data point as described above, the data point is recovered from the rounded and inflated data point.

What is claimed is:

1. A method of lattice-quantizing an eight-long data point in a manner that minimizes storage requirements and computational complexity, comprising the steps of:

a) acquiring the eight-long data point;

b) multiplying each coordinate of the data point by the square root of two to form an inflated data point;

c) rounding each coordinate of the inflated data point to the nearest integer;
d) reducing modulo-two each coordinate of the rounded inflated data point to form an initial codeword;
e) multiplying a parity-check matrix of an eight-bit Extending Hamming Code by the result of step (d) in the form of a column matrix to form a syndrome;
f) correcting any single-bit error, if any, in the initial codeword;
g) correcting any double-bit errors, if any, in the initial codeword;
h) creating a signal packet if the initial codeword does not contain any single-bit and any double-bit errors; and
i) transmitting the signal packet to a receiver.

2. The method of claim 1, wherein said step of correcting any double-bit errors is comprised of the steps of:
a) determining whether or not the top-most bit of the syndrome is 0 while any one of the bottom-three bits of the syndrome is a 1;
b) identifying the four pairs of columns of the parity-check matrix of the eight-bit Extended Hamming Code that sum to the value represented by the bottom-three bits of the syndrome if the top-most bit of the syndrome is a 0 while one of the bottom-three bits of the syndrome is a 1;
c) calculating the difference between corresponding coordinates of the rounded inflated data point and the inflated data point;
d) summing, for each column-pair identified in step (b), the absolute values of two coordinates of the difference obtained in step (c), where the numbers in a particular column-pair indicates which coordinates should be summed;
e) changing the value of the coordinates in the initial codeword that correspond to the column-pair numbers that resulted in the largest sum in step (d); and
f) changing the value of the coordinates in the rounded and inflated data point that correspond to the column-pair numbers that resulted in the largest sum in step (d) by rounding the opposite way the coordinate on which is based the erroneous value of the coordinate in the rounded and inflated data point.

3. The method of claim 1, wherein said step of creating a signal packet is comprised of the steps of:
a) constructing a signal packet, if the initial codeword that does not contain any single-bit errors and double-bit errors is an all 0s codeword in shell 1, having four bits to represent the position of the all 0s codeword in a table containing sixteen codewords in the eight-bit Extended Hamming Code, having one bit to indicate that the rounded and inflated data point is in shell 1, having three bits to indicate which bit in the rounded and inflated data point must be changed to a 2, and having one bit to indicate the polarity of the 2;
b) constructing a signal packet, if the initial codeword that does not contain any single-bit errors and double-bit errors is an all 0s codeword in shell 2, having four bits to represent the position of the all 0s codeword in the table containing sixteen codewords in the eight-bit Extended Hamming Code, having one bit to indicate that the rounded and inflated data point is in shell 2, having five bits to indicate the position in a table where may be found the locations in the rounded and inflated data point that must each be changed to a 2, having one bit to indicate the polarity of the first 2, and having one bit to indicate the polarity of the second 2;
c) constructing a signal packet, if the initial codeword that does not contain any single-bit errors and double-bit errors is an all 1s codeword in shell 2, having four bits to represent the position of the all 1s codeword in the table containing sixteen codewords in the eight-bit Extended Hamming Code, having one bit to indicate the polarity of a first 1 in the rounded and inflated data point, having one bit to indicate the polarity of a second 1 in the rounded and inflated data point, having one bit to indicate the polarity of a third 1 in the rounded and inflated data point, having one bit to indicate the polarity of a fourth 1 in the rounded and inflated data point, having one bit to indicate the polarity of a fifth 1 in the rounded and inflated data point, having one bit to indicate the polarity of a sixth 1 in the rounded and inflated data point, having one bit to indicate the polarity of a seventh 1 in the rounded and inflated data point, and having one bit to indicate the polarity of an eighth 1 in the rounded and inflated data point;
d) constructing a signal packet, if the initial codeword that does not contain any single-bit errors and double-bit errors in a codeword of weight four in shell 1, having four bits to represent the position of the weight-four codeword in the table containing sixteen codewords in the eight-bit Extended Hamming Code, having one bit to indicate that the rounded and inflated data point is in shell 1, having one bit to indicate the polarity of a first 1 in the rounded and inflated data point, having one bit to indicate the polarity of the second 1 in the rounded and inflated data point, having one bit to indicate the polarity of the third 1 in the rounded and inflated data point, and having one bit to indicate the polarity of a fourth 1 in the rounded and inflated data point; and
e) constructing a signal packet, if the initial codeword that does not contain any single-bit errors and double bit-errors is a codeword of weight four in shell 2, having four bits to represent the position of the weight-four codeword in the table containing sixteen codewords in the eight-bit Extended Hamming Code, having one bit to indicate that the rounded and inflated data point is in shell 2, having one bit to indicate the polarity of a first 1 in the rounded and inflated data point, having one bit to indicate the polarity of the second 1 in the rounded and inflated data point, having one bit to indicate the polarity of the third 1 in the rounded and inflated data point, having one bit to indicate the polarity of a fourth 1 in the rounded and inflated data point, having two bits to indicate which 0 in the rounded and inflated data point must be changed to a two, and having one bit to indicate the polarity of the two.

4. The method of claim 1, further comprising the steps of:
a) receiving at the receiver the signal packet transmitted;
b) recovering the codeword from the table of sixteen codewords in the Extended Hamming Code according to the signal packet;
c) modifying the recovered codeword according to the signal packet in order to recover the inflated data point;
d) replacing each one in the rounded and inflated data point by the reciprocal of the square root of two of the same polarity; and
e) replacing each two in the rounded and inflated data point by the square root of two of the same polarity in order to recover the data point.

5. The method of claim 1, wherein said step of correcting any single-bit error is comprised of the steps of:
a) changing the value of the bit in the initial codeword whose location is indicated by the bottom-three bits of the syndrome if the top-most bit in the syndrome is a 1; and b) changing the value of a coordinate in the rounded and inflated data point whose location is indicated by the bottom-three bits of the syndrome if the top-most bit in the syndrome is a 1 by rounding the opposite way the coordinate on which is based the erroneous value of the coordinate in the rounded and inflated data point.

6. The method of claim 5, wherein said step of correcting any double-bit errors is comprised of the steps of:

a) determining whether or not the top-most bit of the syndrome is 0 while any one of the bottom-three bits of the syndrome is a 1;

b) identifying the four pairs of columns of the parity-check matrix of the eight-bit Extended Hamming Code that sum to the value represented by the bottom-three bits of the syndrome if the top-most bit of the syndrome is a 0 while one of the bottom-three bits of the syndrome is a 1;

c) calculating the difference between corresponding coordinates of the rounded inflated data point and the inflated data point;

d) summing, for each column-pair identified in step (b), the absolute values of two coordinates of the difference obtained in step (c), where the numbers in a particular column-pair indicates which coordinates should be summed;

e) changing the value of the coordinates in the initial codeword that correspond to the column-pair numbers that resulted in the largest sum in step (d); and f) changing the value of the coordinates in the rounded and inflated data point that correspond to the column-pair numbers that resulted in the largest sum in step (d) by rounding the opposite way the coordinate on which is based the erroneous value of the coordinate in the rounded and inflated data point.

7. The method of claim 6, wherein said step of creating a signal packet is comprised of the steps of:

a) constructing a signal packet, if the initial codeword that does not contain any single-bit errors and double-bit errors is an all 0s codeword in shell 1, having four bits to represent the position of the all 0s codeword in a table containing sixteen codewords in the eight-bit Extended Hamming Code, having one bit to indicate that the rounded and inflated data point is in shell 1, having three bits to indicate which bit in the rounded and inflated data point must be changed to a 2, and having one bit to indicate the polarity of the 2;

b) constructing a signal packet, if the initial codeword that does not contain any single-bit errors and double-bit errors is an all 0s codeword in shell 2, having four bits to represent the position of the all 0s codeword in the table containing sixteen codewords in the eight-bit Extended Hamming Code, having one bit to indicate that the rounded and inflated data point is in shell 2, having five bits to indicate the position in a table where may be found the locations in the rounded and inflated data point that must each be changed to a 2, having one bit to indicate the polarity of the first 2, and having one bit to indicate the polarity of the second 2;

c) constructing a signal packet, if the initial codeword that does not contain any single-bit errors and double-bit errors is an all 1s codeword in shell 2, having four bits to represent the position of the all 1s codeword in the table containing sixteen codewords in the eight-bit Extended Hamming Code, having one bit to indicate the polarity of a first 1 in the rounded and inflated data point, having one bit to indicate the polarity of a second 1 in the rounded and inflated data point, having one bit to indicate the polarity of a third 1 in the rounded and inflated data point, having one bit to indicate the polarity of a fourth 1 in the rounded and inflated data point, having one bit to indicate the polarity of a fifth 1 in the rounded and inflated data point, having one bit to indicate the polarity of a sixth 1 in the rounded and inflated data point, having one bit to indicate the polarity of a seventh 1 in the rounded and inflated data point, and having one bit to indicate the polarity of an eighth 1 in the rounded and inflated data point;

d) constructing a signal packet, if the initial codeword that does not contain any single-bit errors and double-bit errors in a codeword of weight four in shell 1, having four bits to represent the position of the weight-four codeword in the table containing sixteen codewords in the eight-bit Extended Hamming Code, having one bit to indicate that the rounded and inflated data point is in shell 1, having one bit to indicate the polarity of a first 1 in the rounded and inflated data point, having one bit to indicate the polarity of the second 1 in the rounded and inflated data point, having one bit to indicate the polarity of the third 1 in the rounded and inflated data point, and having one bit to indicate the polarity of a fourth 1 in the rounded and inflated data point; and e) constructing a signal packet, if the initial codeword that does not contain any single-bit errors and double bit-errors is a codeword of weight four in shell 2, having four bits to represent the position of the weight-four codeword in the table containing sixteen codewords in the eight-bit Extended Hamming Code, having one bit to indicate that the rounded and inflated data point is in shell 2, having one bit to indicate the polarity of a first 1 in the rounded and inflated data point, having one bit to indicate the polarity of the second 1 in the rounded and inflated data point, having one bit to indicate the polarity of the third 1 in the rounded and inflated data point, having one bit to indicate the polarity of a fourth 1 in the rounded and inflated data point, having two bits to indicate which 0 in the rounded and inflated data point must be changed to a two, and having one bit to indicate the polarity of the two.

8. The method of claim 7, further comprising the steps of:

a) receiving at the receiver the signal packet transmitted;

b) recovering the codeword from the table of sixteen codewords in the Extended Hamming Code according to the signal packet;

c) modifying the recovered codeword according to the signal packet in order to recover the inflated data point;

d) replacing each one in the rounded and inflated data point by the reciprocal of the square root of two of the same polarity; and e) replacing each two in the rounded and inflated data point by the square root of two of the same polarity in order to recover the data point.

* * * * *